(12) United States Patent
Schnell et al.

(10) Patent No.: US 8,035,378 B2
(45) Date of Patent: Oct. 11, 2011

(54) MAGNETIC RESONANCE SYSTEM WITH POWER LOSS-OPTIMIZED OPERATION

(75) Inventors: Wilfried Schnell, Forchheim (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 289 days.

(21) Appl. No.: 12/332,617

(22) Filed: Dec. 11, 2008

(65) Prior Publication Data

US 2009/0146660 A1 Jun. 11, 2009

(30) Foreign Application Priority Data

Dec. 11, 2007 (DE) .................. 10 2007 059 522

(51) Int. Cl.
*G01V 3/00* (2006.01)
(52) U.S. Cl. ........................................... 324/307
(58) Field of Classification Search .......... 324/300–322; 600/410–435
See application file for complete search history.

(56) References Cited

U.S. PATENT DOCUMENTS

| | | | |
|---|---|---|---|
| 6,759,847 B2 | 7/2004 | Brinker et al. | |
| 6,807,446 B2 * | 10/2004 | Fenn et al. | 607/101 |
| 7,075,301 B2 | 7/2006 | Zhu | |
| 7,279,901 B2 * | 10/2007 | Diehl et al. | 324/320 |
| 7,342,398 B2 | 3/2008 | Bielmeier et al. | |
| 7,417,435 B2 * | 8/2008 | Diehl | 324/320 |
| 7,482,805 B2 * | 1/2009 | Feiweier | 324/307 |
| 7,508,214 B2 * | 3/2009 | Misic | 324/322 |
| 7,511,492 B2 * | 3/2009 | Sodickson et al. | 324/309 |
| 7,622,921 B2 * | 11/2009 | Fontius et al. | 324/307 |
| 7,633,293 B2 * | 12/2009 | Olson et al. | 324/318 |
| 7,795,870 B2 * | 9/2010 | Sodickson et al. | 324/309 |
| 2006/0047198 A1 | 3/2006 | Sugimoto | |
| 2007/0247155 A1 | 10/2007 | Zhu | |
| 2008/0088305 A1 * | 4/2008 | Olson et al. | 324/309 |
| 2008/0272785 A1 * | 11/2008 | Crozier et al. | 324/318 |
| 2010/0076298 A1 * | 3/2010 | Gross | 600/411 |

OTHER PUBLICATIONS

"Simultaneous $B^{+}_{1}$ Homogenization and Specific Absorption Rate Hotspot Suppression Using a Magnetic Resonance Phased Array Transmit Coil," Van den Berg et al., Magnetic Resonance in Medicine, vol. 57 (2007) pp. 577-586.

* cited by examiner

*Primary Examiner* — Dixomara Vargas
(74) *Attorney, Agent, or Firm* — Schiff Hardin LLP

(57) ABSTRACT

A magnetic resonance system has multiple individual transmission antennas each charged with a transmission current to emit an individual excitation field in an examination volume to excite magnetic resonances in a subject, producing a total excitation field as a superimposition of the individual excitation fields. A determination device provided with a spatial distribution of an absorption rate of the examination subject, determines a combination of amplitudes and phase positions for the transmission currents relative to one another such that a locally absorbed power at a first point of the examination subject relative to a locally absorbed power at a second point of the examination subject satisfies a relative condition. The determined combination of amplitudes and phase positions are communicated to a control device, which charges the transmission antennas with transmission currents having the communicated phase positions and amplitudes scaled with a uniform scaling factor for all transmission currents relative to the communicated amplitudes.

14 Claims, 5 Drawing Sheets

FIG 1
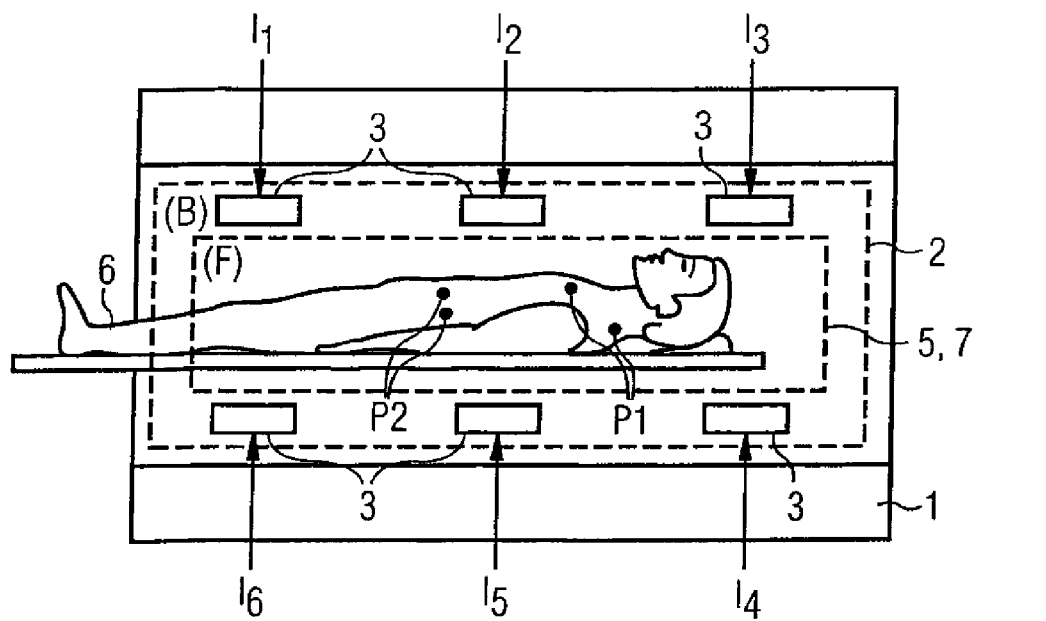
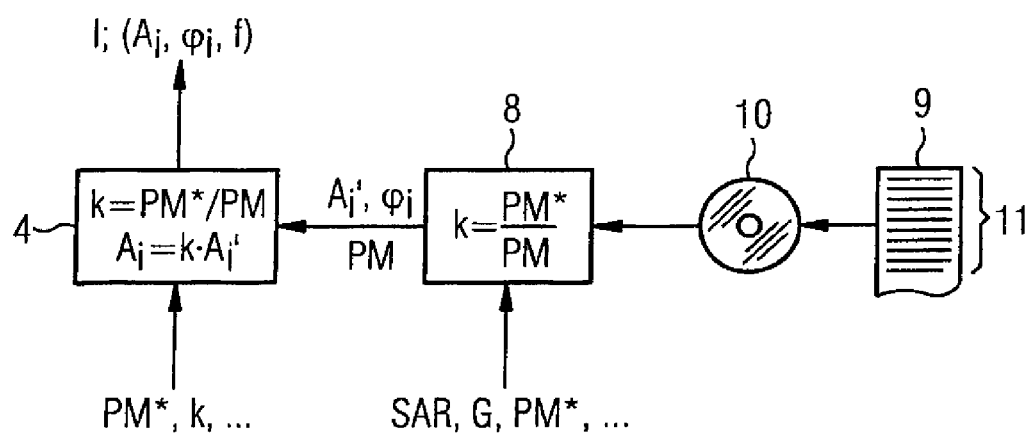

MAGNETIC RESONANCE SYSTEM WITH POWER LOSS-OPTIMIZED OPERATION

BACKGROUND OF THE INVENTION

1. Field of the Invention

The present invention concerns an operating method for a magnetic resonance system of the type having a number of individual transmission antennas that can be each be charged with a transmission current, by means of multiple individual excitation fields are respectively generated in an examination volume of the magnetic resonance examination system to excite magnetic resonances and, due to the superimposition of the individual excitation fields, overall a total excitation field is generated to excite magnetic resonances, wherein the control device charges the transmission antennas with transmission currents.

Furthermore, the present invention concerns an operating program, wherein the operating program encoded with programming instructions that can be executed by a determination device connected to a control device of a magnetic resonance system.

The present invention furthermore concerns a determination device connected to the control device of a magnetic resonance system, the determination device being programmed with such an operating program.

The present invention also concerns a magnetic resonance system that has a number of transmission antennas, an examination volume and a control device, wherein the transmission antennas and the control device interact in operation of the magnetic resonance system.

2. Description of the Prior Art

The basic operation of the items noted above is generally known.

To excite nuclear spins in an examination subject (often a person) to cause emission of magnetic resonance signals from the subject, it is necessary to expose the examination subject to a relatively strong, static magnetic field (basic magnetic field) and then to excite the examination subject (by means of radio-frequency excitation pulses) to emit magnetic resonance signals. It is known that the excitation pulses can hereby be generated by means of a number of transmission antennas. The transmission antennas can be individually charged with transmission currents for this purpose.

The individual excitation fields emitted by the transmission antennas and superimposed into a total excitation field are partially absorbed by the examination subject. The absorption leads to heating of the examination subject. Excessively high power absorption can burn the examination subject or is perceived by the examination subject as subjectively uncomfortable. The amplitudes and the phase positions of the transmission currents therefore must be determined so that the power locally absorbed by the examination subject is not too high at any point of the examination subject.

In the prior art, the amplitudes and the phase positions of the transmission currents are conservatively determined. An estimation ensues such that the maximum of the locally absorbed power is with certainty below a maximum allowable value.

SUMMARY OF THE INVENTION

An object of the present invention is to allow the amplitudes and the phase positions of the transmission currents to be optimized in systems of the type described above.

The object is achieved by an operating method for a magnetic resonance according to the invention, wherein a determination device of the magnetic resonance system receives a spatial distribution of an absorption rate of an examination subject introduced into the examination volume. The determination device determines a combination of amplitudes and phase positions for the transmission currents relative to one another, such that a power locally absorbed at a first point of the examination subject satisfies a relative condition relative to a power locally absorbed at a second point of the examination subject. The determination device communicates the combination of amplitudes and phase positions that it has determined to a control device. The control device charges the transmission antennas with transmission currents whose phase positions correspond with the phase positions communicated by the determination device and whose amplitudes are scaled with a scaling factor that is uniform for all transmission currents relative to the amplitudes communicated by the determination device.

The object is furthermore achieved by an operating program encoded with programming instructions that cause a determination device to execute the aforementioned measures up to and including the communication to the control device.

The object is also achieved by a determination device connected to a control device of a magnetic resonance system, the determination device being programmed with such an operating program.

The above object also is achieved by a magnetic resonance system having a number of transmission antennas, an examination volume, a determination device and a control device, wherein the transmission antennas, the determination device and the control device are fashioned and arranged such that they cooperate in the operation of the magnetic resonance system according to the operating method described above.

In principle, it is possible for the first and second point to be arbitrary points of the examination subject. However, the first point and second point of the examination subject advantageously correspond to those points of the examination subject at which the examination subject locally absorbs the most and least power in the respective combination of amplitudes and phase positions. An optimally uniform distribution over the examination subject of the power absorbed in total by the examination subject can be achieved via this measure.

It is possible to determine the first and second point only once, or for those points to be hard-set by the determination device. Preferably, however, the determination device automatically determines the first and second points of the examination subject for each combination of amplitudes and phase positions.

It is possible for the scaling to be conducted by the control device. In this case, the determination device determines a maximum occurring absorbed power given the communicated combination of amplitudes and phase positions and communicates this power to the control device. Using a maximum allowable value of the power that can be locally absorbed by the examination subject and the communicated maximum occurring absorbed power, the control device automatically determines the uniform scaling factor.

Alternatively, the scaling can be implemented directly by the determination device. In this case, the determination of the scaling factor and the scaling ensue through the determination device.

The relative condition of the determination device can be hard-set, but preferably the determination device receives the relative condition. A more flexible operation of the determination device is possible in this manner.

For example, the relative condition can be that a ratio of the power locally absorbed at the first point of the examination subject relative to the power locally absorbed at the second point of the examination subject is minimal. Alternatively, the relative condition can be that a ratio of the power locally absorbed at the first point of the examination subject relative to the power locally absorbed at the second point of the examination subject lies below a limit value. In the latter case, the limit value of the determination device can be hard-set, but the determination device preferably receives the limit value.

The transmission antennas can be exclusively transmission antennas that exhibit a magnetic near field. Alternatively, it is possible (if only theoretically) that the transmission antennas are exclusively transmission antennas that exhibit an electrical near field. It is preferable that at least one of the transmission antennas exhibits a magnetic near field and at least one other of the transmission antennas exhibits an electrical near field.

The determination device advantageously receives information about the type and/or the arrangement and/or the design of the transmission antennas. A very flexible operation of the determination device is possible via this procedure.

BRIEF DESCRIPTION OF THE DRAWINGS

FIG. 1 schematically illustrates the basic design of a magnetic resonance system.

DESCRIPTION OF THE PREFERRED EMBODIMENTS

Figure 2:
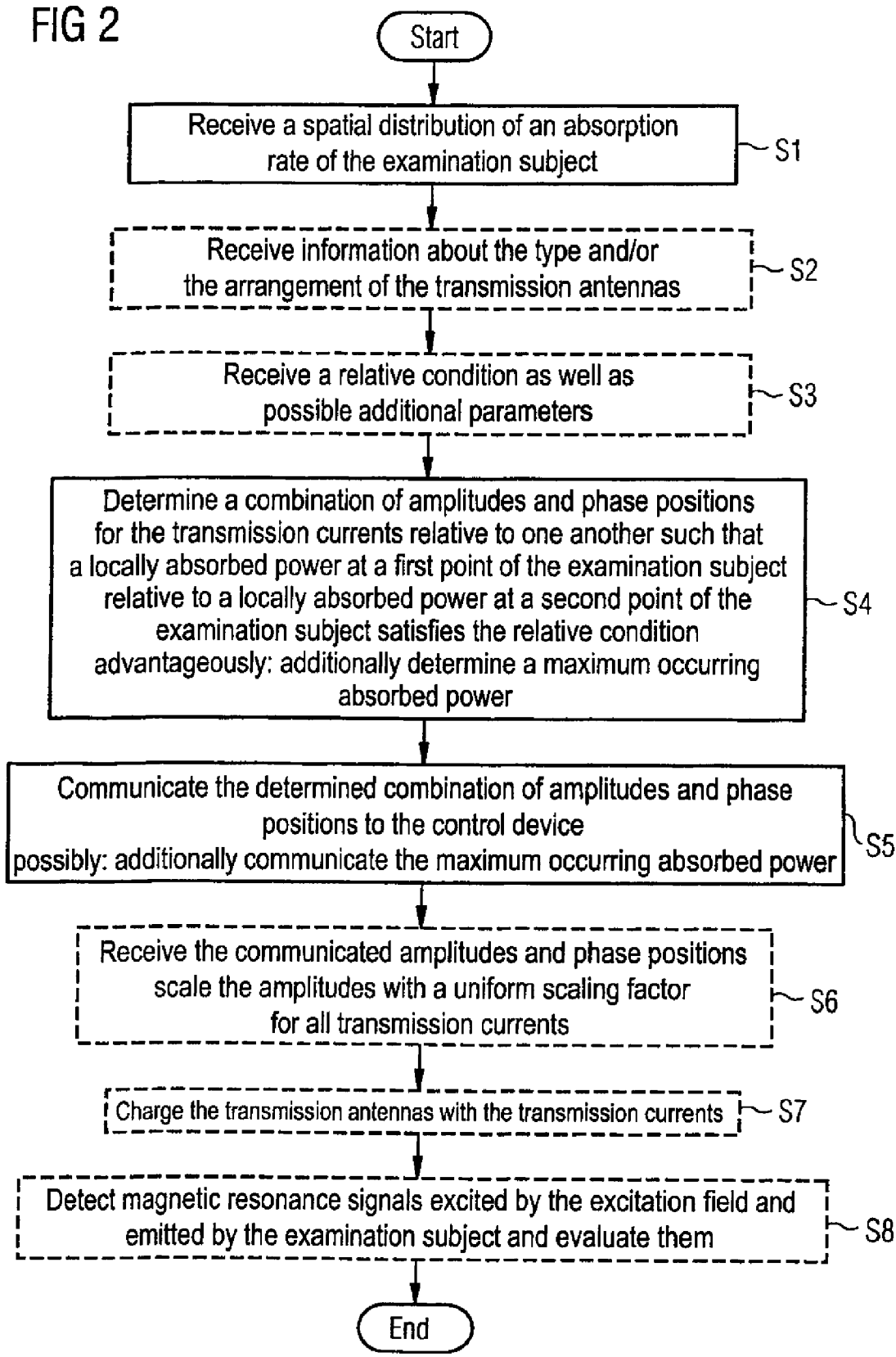
FIGS. 2 through 4 are flowcharts for explaining embodiments of the method according to the invention.

In connection with FIG. 1, the design of a magnetic resonance system is schematically explained in the following insofar as the design is relevant for the understanding of the present invention.

According to FIG. 1, the magnetic resonance system has a basic field magnet 1. The basic field magnet 1 generates a static, locally essentially homogeneous basic magnetic field B in a field region 2 of the magnetic resonance system. Furthermore, the magnetic resonance has a number of transmission antennas 3. In a preferred embodiment of the present invention, at least one of the transmission antennas 3 exhibits a magnetic near field, at least one other of the transmission antennas 3 exhibits an electrical near field. Both types of are known to those of ordinary skill in the design of magnetic resonance systems.

Six transmission antennas 3 are illustrated in FIG. 1, but the number of transmission antennas 3 could be greater or less than six. There must only be at least two. Where necessary for better understanding of the present invention, a subscript index i is added to identify the respective transmission antennas 3 as well as to values (in particular amplitudes A and phase positions ϕ of transmission currents I) related to the transmission antennas 3, in order to be able to differentiate the individual transmission antennas 3 from one another.

The magnetic resonance system also has a control device 4. The transmission antennas 3 can each be individually charged with a high-frequency transmission current I by the control device 4. The frequency f of the transmission currents I is normally the same for all transmission antennas 3.

When the transmission antennas 3 are charged with their respective transmission currents I, they each generate a high-frequency individual excitation field F' in the excitation region 5 of the magnetic resonance system. The individual excitation fields F' superimpose to form a total excitation field F. An examination subject 6 (usually a person) can be excited to magnetic resonances by means of the total excitation field F when the examination subject 6 is exposed to both the basic magnetic field B and the total excitation field F. The intersection of the excitation region 5 and of the magnetic field region 2 therefore defines an examination volume 7 of the magnetic resonance system.

The magnetic resonance system furthermore has a determination device 8. The determination device 8 is connected to the control device 4. It is normally fashioned as a software-programmable device, for example as a PC. The determination device 8 can be combined with the control device 4 into one unit.

The determination device 8 is programmed by an operating program 9 that is supplied to the determination device 8. For example, the operating program 9 can be supplied to the determination device 8 via a computer network connection (not shown). Alternatively, the operating program 9 can be supplied to the determination device 8 via a data medium 10 (shown as an example: a CD-ROM 10) on which the operating program 9 is stored in (exclusively) machine-readable form.

The operating program 9 embodies machine code 11 that can be executed by the determination device 8. The execution of the machine code 11 by the determination device 8 causes the determination device 8 to execute a method that is subsequently explained in detail in connection with FIG. 2. The action of the control device 4—in particular the interaction of determination device 8, control device 4 and transmission antennas 3—is also explained in connection with FIG. 2 insofar as it is relevant to the present invention.

According to FIG. 2, in Step S1 the determination device 8 receives a spatial distribution of an absorption rate SAR (SAR=specific absorption rate) of the examination subject 6. The absorption rate SAR is in all cases spatially resolved in three dimensions. It is registered (with sufficient precision) relative to the coordinate system of the magnetic resonance system (and therefore relative to the transmission antennas 3).

In a Step S2, the determination device 8 furthermore receives information about the type and/or the arrangement of the transmission antennas 3. The information can include (for example for each transmission antenna 3) whether the respective transmission antenna 3 exhibits an electrical or a magnetic near field, the location at which the respective transmission antenna 3 is arranged, and how the respective transmission antenna 3 is oriented and/or fashioned. The term "fashioned" specifies its design in more detail within the antenna type and the configuration of the respective transmission antenna 3. For example, in the case of a magnetic transmission antenna, it can be specified in detail whether it is a loop antenna or a butterfly antenna or a different antenna, and how this antenna is dimensioned.

Step S2 is optional. It can therefore be omitted and for this reason is indicated with dashed lines in FIG. 2. If Step S2 is omitted, the corresponding information must be known in some other way to the determination device 8. For example, it can be hard-set by the determination device 8.

In Step S3, the determination device 8 receives a relative condition as well as possible additional parameters. Step S3 will later be explained in detail in connection with FIG. 5 through 7.

Step S3 is likewise optional and therefore is indicated with dashed lines in FIG. 2. If it is omitted, the relative condition must be known in some other way to the determination device 8; for example, it can be hard-set.

In Step S4, the determination device 8 determines a combination of amplitudes A' and phase positions φ for the transmission currents I relative to one another. The determination device 8 determines the combination such that a power P locally absorbed at a first point P1 of the examination subject 6 satisfies the relative condition relative to a power P' locally absorbed at a second point P2 of the examination subject 6. Step S4 will be explained in detail in connection with FIG. 4.

Furthermore, in the framework of Step S4 the determination device 8 advantageously determines a maximum occurring absorbed power PM given the determined combination of amplitudes A' and phase positions φ, but this is not absolutely necessary.

In Step S5, the determination device 8 communicates the combination of amplitudes A' and phase positions φ that it has determined to the control device 4. Insofar as the maximum absorbed power PM has also been determined in Step S4, the maximum absorbed power PM can also be communicated to the control device 4 in Step S5.

Steps S6, S7 and S8 are then executed. Steps S6 through S8 are essential in the scope of the total operation of the magnetic resonance system. However, they are not executed by the determination device 8 (except in the event that the control device 4 and the determination device 8 form a common unit) and thus are represented with dashed lines in FIG. 2 for this reason. Steps S6 and S7 are executed by the control device 4, Step S8 by a detection device (not shown in FIG. 1) that can but does not have to be identical with the control device 4.

In Step S6 the control device 4 receives the amplitudes A' and phase positions φ communicated by the determination device 8. The control device 4 also scales the communicated amplitudes A' with a scaling factor k that is uniform for all transmission currents I.

It is possible for the scaling factor k to be provided to the control device 4 by an outside source. Alternatively, it can be hard-set or can be automatically determined by the control device 4. For this purpose (see FIG. 1), a maximum allowable value PM* of the power that can be locally absorbed by the examination subject 6 is provided by an outside party to the control device 4. This value PM* is received by the control device 4. Alternatively, the value PM* can be hard-set. Using the maximum allowable value PM* and the communicated maximum occurring, absorbed power PM, the control device 4 in this case automatically determines the scaling factor k, advantageously using the relationship $$k=PM^*/PM$$

In Step S7, the control device 4 charges the transmission antennas 3 with the transmission currents I. The phase positions φ of the transmission currents I hereby correspond with the phase positions φ that were communicated to the control device 4 by the determination device 8. The amplitudes A of the transmission currents I are scaled with the scaling factor k relative to the amplitudes A' communicated by the determination device 8. As already mentioned, the scaling factor k is hereby uniform for all transmission currents I.

In Step S8, magnetic resonance signals excited by means of the excitation field F and emitted by the examination subject 6 are detected and possibly evaluated. Details of the detection and evaluation of the magnetic resonance signals are not the subject matter of the present invention, but this is shown in FIG. 2 for completeness.

Figure 3:
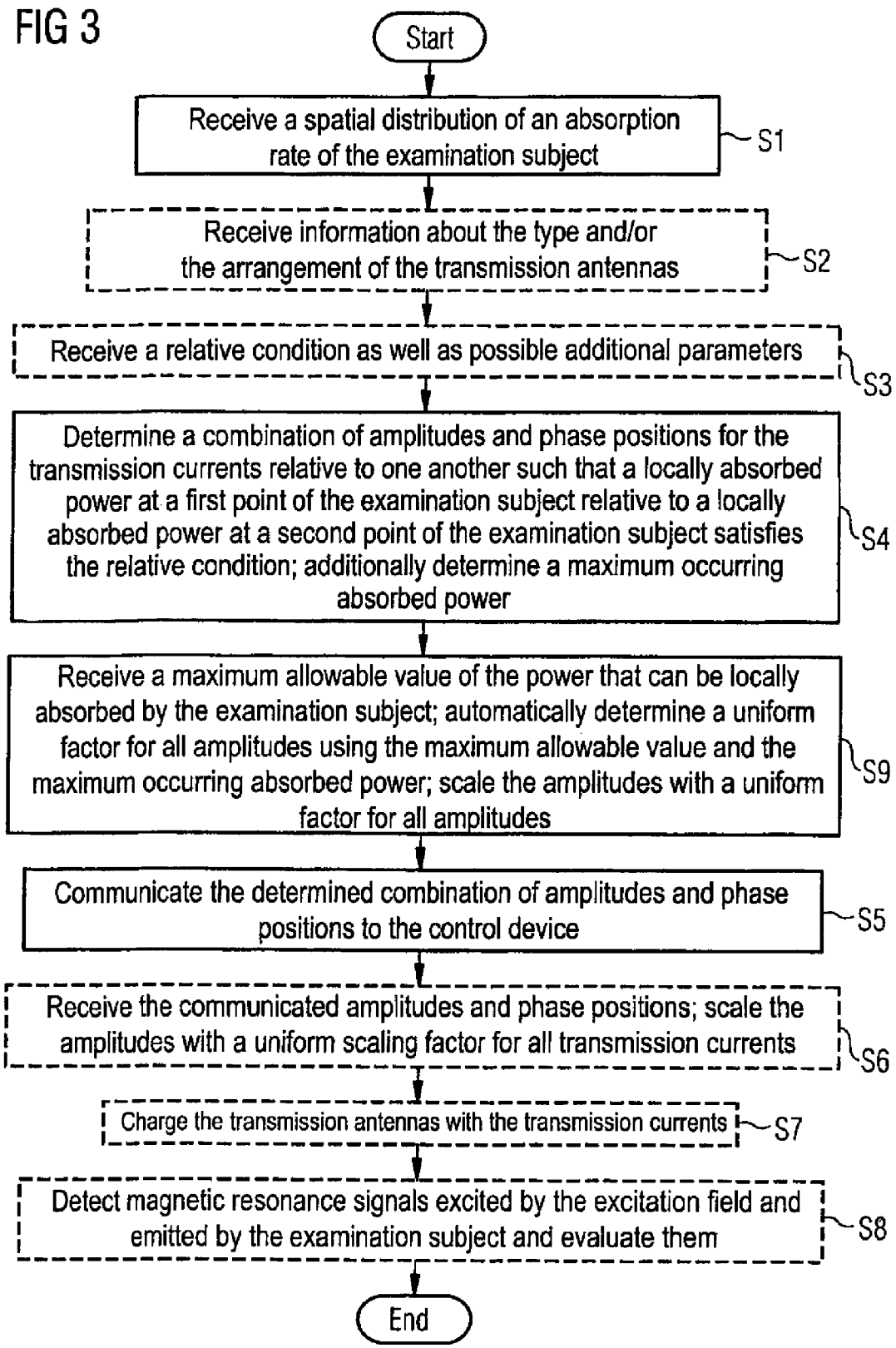

FIG. 3 shows an embodiment alternative to the procedure from FIG. 2. The significant difference relative to the embodiment from FIG. 2 is that, in the embodiment according to FIG. 3, a Step S9 is inserted between the Steps S4 and S5. In Step S9 the determination device 8 receives the maximum allowable value PM* of the power that can be locally absorbed by the examination subject 6 from an outside party, automatically determines a factor k' uniform for all amplitudes A' using the maximum allowable value PM* and the maximum occurring absorbed power PM, and scales the amplitudes A' with the factor K'. The factor k' can be determined by the determination device 8 analogous to the scaling factor k.

In the embodiment according to FIG. 3, the determination of the maximum occurring absorbed power PM in Step S4 is thus mandatory. The communication of the maximum occurring absorbed power PM in Step S5 can be omitted.

In the embodiment according to FIG. 3, the scaling by the control device 4 can alternatively be omitted (in consequential scaling with a scaling factor k=1) or be limited to a scaling with a scaling factor k smaller than or at maximum equal to one.

The specification of the maximum absorbable power PM* by an outside source is not mandatory. It can alternatively be hard-set by the determination device 8.

Step S4 from FIG. 2 can be implemented in various ways. The basis of Step 4 is the fact that that the powers P, P' at the points P1 and P2 can be determined not only for a combination of amplitudes A' and phase positions φ, and then the amplitudes A' are uniformly scaled, but also the amplitudes A' and/or the phase positions up can be set relative to one another. For example, the amplitude $A_1'$ of the transmission current $I_1$ can be set to a normalized value for a first $3_1$ of the transmission antennas $3_i$, and the phase position $φ_1$ for this transmission current $I_1$ can be set to zero, and the other amplitudes $A_i'$ (i=2, 3, . . . ) and phase positions $φ_i$ (i=2, 3, . . . ) are varied. An example of a possible implementation of Step S4 from FIG. 2 is subsequently explained in connection with FIG. 4.

Figure 4:
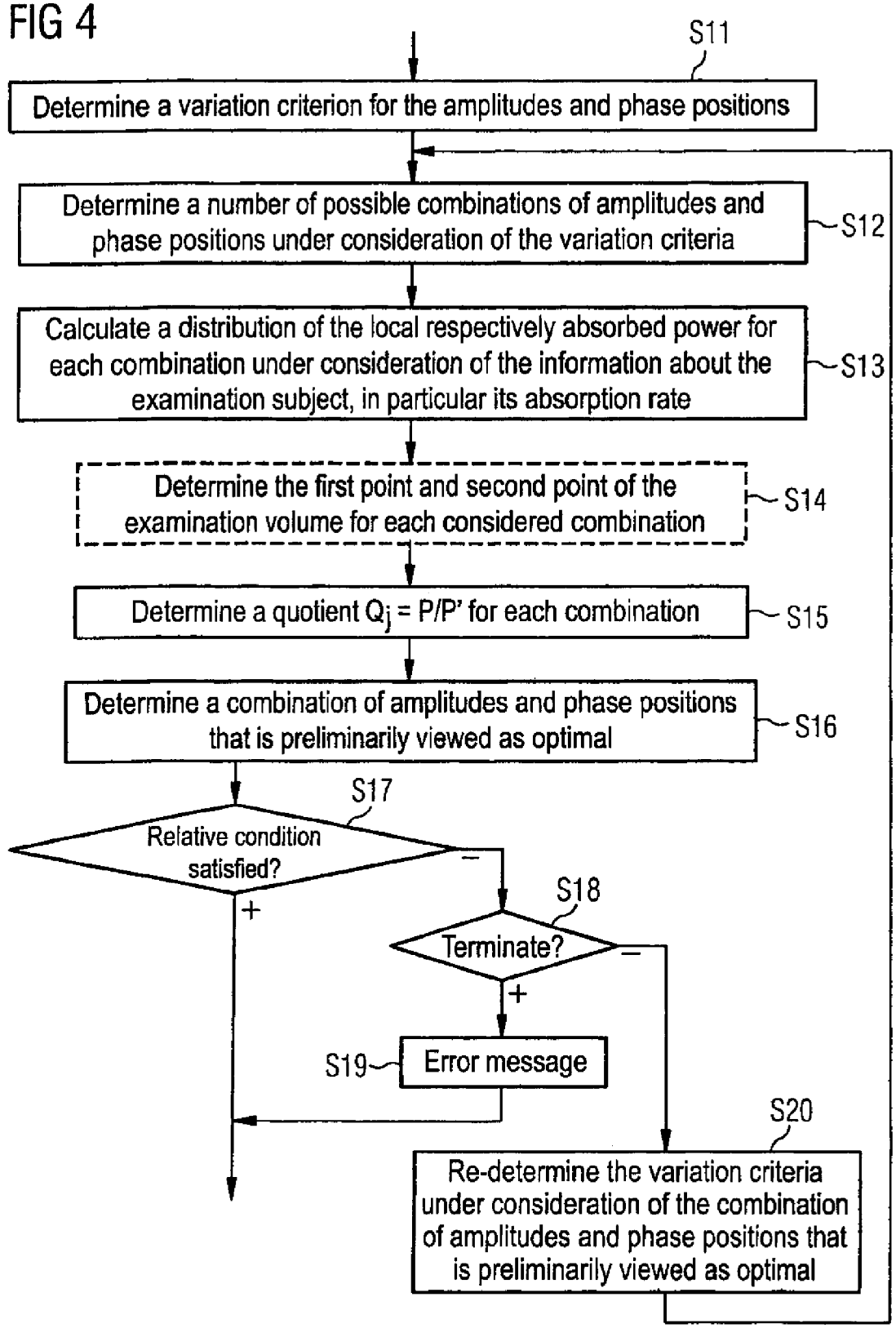

According to FIG. 4, in Step S11 the determination device 8 determines a variation criterion for the amplitudes A' and the phase positions φ. For example, in Step S11 an absolute or relative increment can be determined in which the amplitudes $A_i'$ (i=2, 3, . . . ) and the phase positions $φ_i$ (i=2, 3, . . . ). Alternatively or additionally, start values or value ranges for absolute values of the amplitudes $A_i'$ (i=1, 2, . . . ) and/or relative values of the amplitudes $A_i'$ (i=2, 3, . . . ) and/or the phase positions $φ_i$ (i=2, 3, . . . ).

In Step S121 the determination device 8 determines a number of possible combinations of amplitudes A and phase positions φ of the transmission currents I. The determination device 8 hereby naturally considers the previously determined variation criteria. In Step S13, the determination device 8 calculates a distribution of the respective locally absorbed power for each combination determined in Step S12. The determination device 8 naturally takes into account information about the examination subject 6, in particular the local distribution of the absorption rate SAR. It furthermore takes into account the type, arrangement and/or design of the transmission antennas 3.

In Step S14, the determination device 8 determines the first and second point P1, P2 of the examination subject 6 for each combination of amplitudes A' and phase positions φ considered in Step S13. For example, the determination device 8 can determine for each combination considered in Step S13 that point of the examination subject 6 at which the examination subject 6 locally absorbs the greatest and the smallest power PM, PM' given the respective combination of amplitudes A' and phase positions φ. The first point P1 corresponds to that point of the examination subject 6 with the greatest absorbed power PM, the second point P2 of the examination subject to the point with the least absorbed power PM'. In particular from FIG. 1 it is hereby apparent that the first and second points P1, P2 can be different from combination to combination.

Step S14 is preferred but merely optional. It can be omitted. For this reason, it is indicated in dashed lines in FIG. 4. If it is omitted, the first and second points P1, P2 can, for example, be hard-set or be predetermined by a user (not shown in FIG. 1).

IN Step S15, the determination device 8 determines a quotient $Q_j$ for each combination determined in the framework of Step S12. The quotient $Q_j$ is defined as $$Q_j = P/P'.$$

In Step S16, the determination device 8 determines a combination of amplitudes A' and phase positions φ that are preliminarily viewed as optimal. For example, in the framework of Step S16 the determination device 8 can select those of the combinations determined in the framework of Step S12 in which the quotient $Q_j$ is minimal. Alternatively, a partial derivation according to each variable $A_i'$, $\phi_i$ (i=2, 3, ...) can be formed in a known manner, starting from a start combination of amplitudes A' and phase positions φ, and then a step can be taken in the direction of the gradient.

In Step S17, the determination device 8 checks whether the relative condition is satisfied. Step S17 will later be explained in more detail in connection with FIG. 5 through 7.

When the relative condition is satisfied, the determination of the combination of amplitudes A and phase positions φ is ended. Otherwise, the determination device 8 transitions to Step S18.

In Step S18 the determination device 8 checks whether a termination criterion is satisfied, for example whether a maximum number of loop passes has been exceeded. If this is the case, the determination device 8 transitions to a Step S19 in which it outputs an error message. Otherwise, the determination device 8 transitions to Step S20. In Step S20, the determination device 8 re-determines the variation criteria under consideration of the combination of amplitudes A' and phase positions φ that is determined in Step S16. For example, it can vary a start point, an allowable value range and/or an increment. From Step S20 the determination device 8 returns to Step S12.

Figure 5:
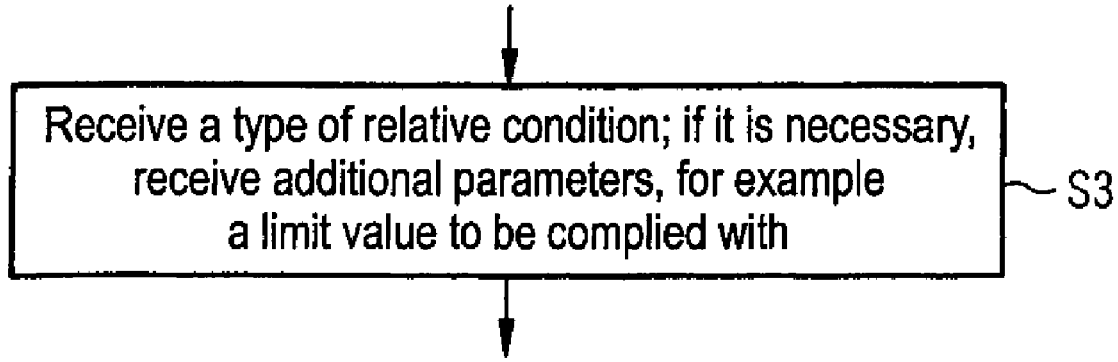
FIGS. 5 through 7 show embodiments of individual steps of the flowcharts of FIGS. 2 through 4.

FIG. 5 shows a possible embodiment of Step S3 from FIG. 2 and FIG. 3. According to FIG. 5, in the framework of Step S3 the determination device 8 initially receives a type of relative condition, for example whether an optimization of the quotient $Q_j$ should be checked or only the satisfaction of a specific numerical value. Furthermore, in the framework of Step S3 the determination device 8 receives additional parameters insofar as this is required. For example, the additional parameters can be a limit value G to be complied with and/or a maximum allowable number of passes through the loop from FIG. 4.

Step S17 from FIG. 4 is also correspondingly designed depending on which condition according to Step S3 from FIG. 2 and FIG. 3 should be checked.

Figure 6:
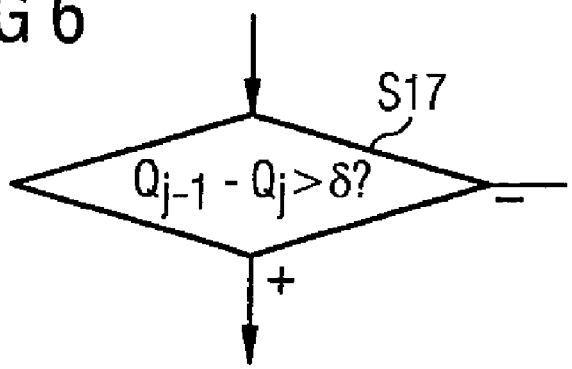

For example, if an optimization of the quotient $Q_j$ should be checked in the framework of Step S17, Step S17 is designed corresponding to FIG. 6. In the framework of the embodiment according to FIG. 6, the determination device 8 checks whether the quotient $Q_j$ determined in the current pass of Steps S12 through S16 appreciably deviates from the quotient $Q_{j-1}$ of the previous pass. If no or nearly no deviation is present, it can be assumed that an optimum was determined. In this case, the relative condition is satisfied. Otherwise, a new pass ensues through the loop of Steps S18, S20 and S12 through S16. A bound 6 within which the quotients $Q_j$ and $Q_{j-1}$ are viewed as equal can hereby be one of the parameters that are predetermined in Step S3 corresponding to FIG. 5. Alternatively, the bound δ can be hard-set, for example.

Figure 7:
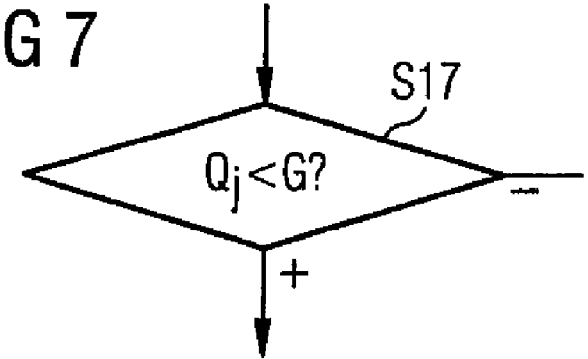

If the quotient $Q_j$ should merely be checked for compliance with the limit value G, Step S17 can be designed corresponding to FIG. 7, for example. In Step S17 according FIG. 7, the quotient $Q_j$ is checked for compliance with the limit value G. If the limit value G is complied with, the method is ended. Otherwise, a new pass ensues through the loop. The limit value G using which it is decided whether a determined combination of amplitudes A' and phase positions φ is good enough can hereby be one of the parameters that is predetermined in Step S3 corresponding to FIG. 5. Alternatively, the limit value G can be hard-set.

The present invention possesses many advantages. In particular, it is possible to determine the amplitudes A and the phase positions φ such that an optimal excitation of the examination subject 6 to magnetic resonances is possible with limited heating of the examination subject 6.

Although modifications and changes may be suggested by those skilled in the art, it is the intention of the inventors to embody within the patent warranted hereon all changes and modifications as reasonably and properly come within the scope of their contribution to the art.

We claim as our invention:

1. An operating method for a magnetic resonance system comprising a plurality of individual transmission antennas that are respectively charged individually with transmission current to cause each individual transmission antenna to generate an individual excitation field in an examination volume of the magnetic resonance system, said individual excitation fields superimposing to form a total excitation field in an examination subject in said examination volume that causes magnetic resonance signals to be emitted from the subject, said method comprising the steps of:

providing a determination device of the magnetic resonance system with a designation of a spatial distribution of an absorption rate of the examination subject in the examination volume with regard to absorption of energy of a type radiated by said individual transmission antennas;

in said determination device, automatically determining a combination of amplitudes and phase positions for the respective transmission currents supplied to the individual transmission antennas relative to each other, to cause a power that is locally absorbed at a first point of the examination subject to satisfy a relative condition with respect to a power locally absorbed at a second point of the examination subject;

from the determination device, communicating said combination of amplitudes and phase positioned to a control device;

in said control device, generating respective transmission currents for the respective individual transmission antennas, to give the respective transmission currents phase positions relative to each other corresponding to the phase positions communicated by the determination device, and amplitudes that are scaled with a scaling factor that is uniform for all of said transmission currents relative to the amplitudes communicated by said determination device;

in said determination device, determining a maximum absorbed power that occurs for the communicated combination of amplitudes and phase positions, and communicating said maximum absorbed power to said control device;

providing said control device with a maximum allowable value of power that is locally absorbable by the examination subject; and in said control device, automatically determining said uniform scaling factor using said maximum allowable value and the communicated maximum absorbed power.

2. A method as claimed in claim 1 comprising, in said determination device, employing, as said first point and said second point of the examination subject, a point of the examination subject at which the examination subject locally absorbs the most power in said combination of amplitudes and phase positions and a point of the examination subject at which the examination subject absorbs the leased power in the combination of amplitudes and phase positions, respectively.

3. An operating method as claimed in claim 1 comprising providing said determination device with said relative condition from an external source.

4. An operating method as claimed in claim 1 comprising employing, as said relative condition, minimization of a ratio of the locally absorbed power at the first point of the examination subject relative to the locally absorbed power at the second point of the examination subject.

5. A method as claimed in claim 1 comprising employing, as said relative condition, a requirement that a ratio of the locally absorbed power at the first point of the examination subject relative to the locally absorbed power at the second point of the examination subject is below a limit value.

6. An operating method as claimed in claim 5 comprising providing the limit value to said determination device from an external source.

7. An operating method as claimed in claim 1 comprising employing, as at least one of said individual transmission antennas, an individual transmission antenna having a magnetic near field and employing, as at least one other of said individual transmission antennas, an individual transmission antenna having an electrical near field.

8. An operating method as claimed in claim 1 comprising providing said determination device with a designation of at least one characteristic of the respective individual transmission antennas, selected from the group consisting of antenna type, antenna dimensions, and antenna design.

9. A non-transitory computer-readable medium encoded with programming instructions for operating method for a magnetic resonance system comprising a plurality of individual transmission antennas that are respectively charged individually with transmission current to cause each individual transmission antenna to generate an individual excitation field in an examination volume of the magnetic resonance system, said individual excitation fields superimposing to form a total excitation field in an examination subject in said examination volume that causes magnetic resonance signals to be emitted from the subject, and comprising a determination device that is provided with a designation of a spatial distribution of an absorption rate of the examination subject in the examination volume with regard to absorption of energy of a type radiated by said individual transmission antennas, and comprising a control device, said programming instructions causing:

said determination device to determine a combination of amplitudes and phase positions for the respective transmission currents supplied to the individual transmission antennas relative to each other, to cause a power that is locally absorbed at a first point of the examination subject to satisfy a relative condition with respect to a power locally absorbed at a second point of the examination subject, and to communicate said combination of amplitudes and phase positioned to said control device;

said control device to generate respective transmission currents for the respective individual transmission antennas, to give the respective transmission currents phase positions relative to each other corresponding to the phase positions communicated by the determination device, and amplitudes that are scaled with a scaling factor that is uniform for all of said transmission currents relative to the amplitudes communicated by said determination device;

said control device is provided with a maximum allowable value of power that is locally absorbable by the examination subject said determination device to determine a maximum absorbed power that occurs for the communicated combination of amplitudes and phase positions, and communicate said maximum absorbed power to said control device; and said control device to determine said uniform scaling factor using said maximum allowable value and the communicated maximum absorbed power.

10. A computer-readable medium as claimed in claim 9 wherein said programming instructions cause said determination device to employ, as said first point and said second point of the examination subject, a point of the examination subject at which the examination subject locally absorbs the most power in said combination of amplitudes and phase positions and a point of the examination subject at which the examination subject absorbs the leased power in the combination of amplitudes and phase positions, respectively.

11. A computer-readable medium as claimed in claim 9 wherein said programming instructions cause said determination device to employ, as said relative condition, minimization of a ratio of the locally absorbed power at the first point of the examination subject relative to the locally absorbed power at the second point of the examination subject.

12. A computer-readable medium as claimed in claim 9 wherein said programming instructions cause said determination device to employ, as said relative condition, a requirement that a ratio of the locally absorbed power at the first point of the examination subject relative to the locally absorbed power at the second point of the examination subject is below a limit value.

13. A determination device for use in a magnetic resonance system comprising a plurality of individual transmission antennas that are respectively charged individually with transmission current to cause each individual transmission antenna to generate an individual excitation field in an examination volume of the magnetic resonance system, said individual excitation fields superimposing to form a total excitation field in an examination subject in said examination volume that causes magnetic resonance signals to be emitted from the subject, said magnetic resonance system further comprising a control device, said determination device comprising:

an input that receives a designation of a spatial distribution of an absorption rate of the examination subject in the examination volume with regard to absorption of energy of a type radiated by said individual transmission antennas;

a computerized processor that automatically determines a combination of amplitudes and phase positions for the respective transmission currents supplied to the individual transmission antennas relative to each other, to cause a power that is locally absorbed at a first point of the examination subject to satisfy a relative condition with respect to a power locally absorbed at a second point of the examination subject;

an output from which the determination device communicates said combination of amplitudes and phase positioned to said control device in a form that causes said control device, generating respective transmission currents for the respective individual transmission antennas, to give the respective transmission currents phase positions relative to each other corresponding to the phase positions communicated by the determination device, and amplitudes that are scaled with a scaling factor that is uniform for all of said transmission currents relative to the amplitudes communicated by said determination device;

processor being configured to generate respective transmission currents for the respective individual transmission antennas, to give the respective transmission currents phase positions relative to each other corresponding to the phase positions communicated by the determination device, and amplitudes that are scaled with a scaling factor that is uniform for all of said transmission currents relative to the amplitudes communicated by said determination device;

said determination device being configured to determine a maximum absorbed power that occurs for the communicated combination of amplitudes and phase positions, and to communicate said maximum absorbed power to said processor;

said processor being provided with a maximum allowable value of power that is locally absorbable by the examination subject; and said processor being configured to automatically determine said uniform scaling factor using said maximum allowable value and the communicated maximum absorbed power.

14. A magnetic resonance system comprising:

a plurality of individual transmission antennas that are respectively charged individually with transmission current to cause each individual transmission antenna to generate an individual excitation field in an examination volume of the magnetic resonance system, said individual excitation fields superimposing to form a total excitation field in an examination subject in said examination volume that causes magnetic resonance signals to be emitted from the subject;

a determination device provided with a designation of a spatial distribution of an absorption rate of the examination subject in the examination volume with regard to absorption of energy of a type radiated by said individual transmission antennas;

said determination device being configured to automatically determine a combination of amplitudes and phase positions for the respective transmission currents supplied to the individual transmission antennas relative to each other, to cause a power that is locally absorbed at a first point of the examination subject to satisfy a relative condition with respect to a power locally absorbed at a second point of the examination subject;

a control device that operates said transmission antennas;

said determination device communicating said combination of amplitudes and phase positioned to said control device;

said control device being configured to generate respective transmission currents for the respective individual transmission antennas, to give the respective transmission currents phase positions relative to each other corresponding to the phase positions communicated by the determination device, and amplitudes that are scaled with a scaling factor that is uniform for all of said transmission currents relative to the amplitudes communicated by said determination device;

said determination device being configured to determine a maximum absorbed power that occurs for the communicated combination of amplitudes and phase positions, and to communicate said maximum absorbed power to said control device;

said control device being provided with a maximum allowable value of power that is locally absorbable by the examination subject; and said control device being configured to automatically determine said uniform scaling factor using said maximum allowable value and the communicated maximum absorbed power.

* * * * *